United States Patent
Bodini

(10) Patent No.: US 6,199,701 B1
(45) Date of Patent: Mar. 13, 2001

(54) STRUCTURE AND A METHOD FOR HOUSING EQUIPMENT PIECES IN SPACE VEHICLES SUCH AS TELECOMMUNICATION SATELLITES

(75) Inventor: Amedeo Bodini, Cremona (IT)

(73) Assignee: Negesat Di Boer Fabrizio & C. SNC., Turin (IT)

(*) Notice: Subject to any disclaimer, the term of this patent is extended or adjusted under 35 U.S.C. 154(b) by 0 days.

(21) Appl. No.: 09/273,156

(22) Filed: Mar. 19, 1999

(30) Foreign Application Priority Data

Mar. 23, 1998 (EP) .................................................. 98830170

(51) Int. Cl.[7] .......................... B65B 23/00; B65D 85/38; B65D 81/09
(52) U.S. Cl. ............................ 206/723; 206/584; 53/472; 53/474; 361/699
(58) Field of Search .............................. 53/472, 474, 432, 53/239; 206/584, 723

(56) References Cited

U.S. PATENT DOCUMENTS

| | | | |
|---|---|---|---|
| 2,956,672 | * 10/1960 | Kirkpatrick | 53/474 |
| 3,222,843 | * 12/1965 | Schneider | 53/472 |
| 3,446,882 | * 5/1969 | Landon | 53/472 |
| 3,450,253 | * 6/1969 | Nielsen | 53/472 |
| 3,667,593 | * 6/1972 | Pendelton | 53/472 |
| 4,030,267 | * 6/1977 | Arnaud | 53/472 |
| 4,267,927 | * 5/1981 | English, Jr. | 206/723 |
| 5,515,975 | * 5/1996 | Jarvis et al. | 206/584 |

* cited by examiner

Primary Examiner—John Sipos
(74) Attorney, Agent, or Firm—Paul & Paul

(57) ABSTRACT

A structure and a method for housing equipment pieces in space vehicles in which the pieces of equipment are suspended to the inside of a sealable container, said container (1) is then closed and filled by a light-weight loose material and a nonfreezing thermally conducting liquid under pressure.

12 Claims, 2 Drawing Sheets

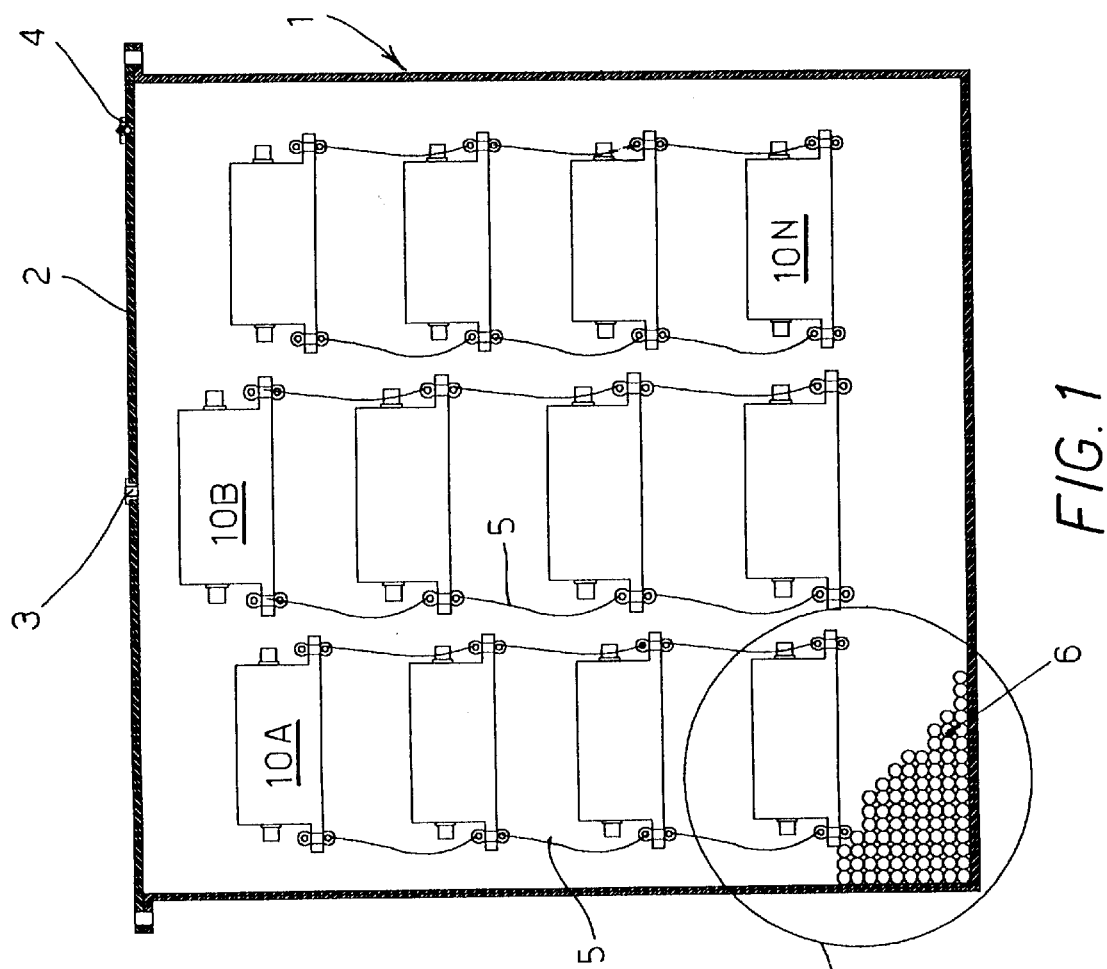
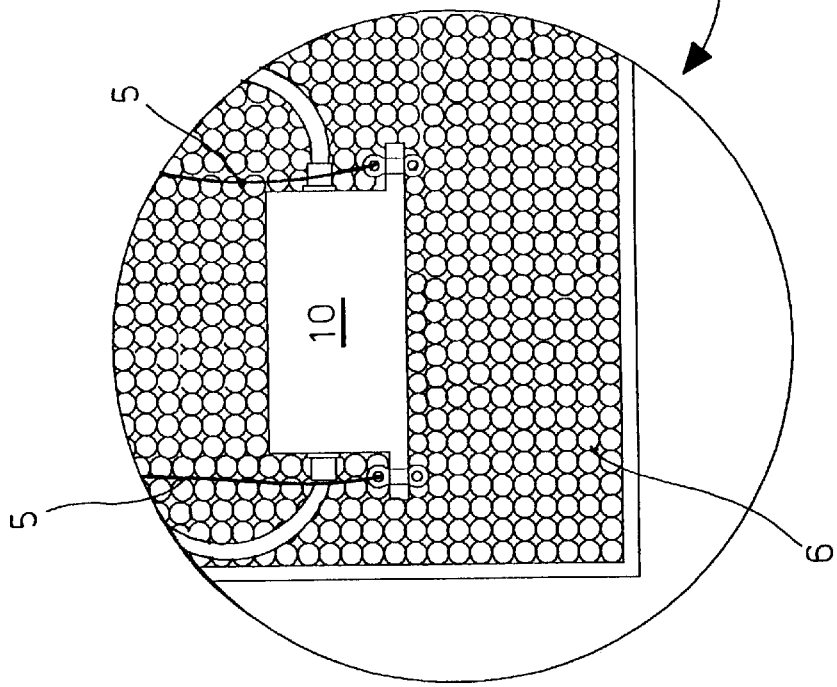
FIG. 1
FIG. 1A

STRUCTURE AND A METHOD FOR HOUSING EQUIPMENT PIECES IN SPACE VEHICLES SUCH AS TELECOMMUNICATION SATELLITES

TECHNICAL FIELD

The present invention relates to a structure for housing equipment pieces in space vehicles such as telecommunication satellites. The invention further relates to a method for housing equipment pieces in space vehicles such as telecommunication satellites.

BACKGROUND ART

The inside of telecommunication satellites and similar space vehicles is susbstantially occupied, besides fuel tanks, by a variety of electronic boxes, i.e. enclosed and sealed cases housing electronic devices and circuits, that are to be secured to the satellite frame and electrically connected to each other and to external devices. Such electronic boxes, collectively known as payload, include for example batteries, signal transponders, data handling equipment, converters and so on.

Within the spacecraft structure each box has a fixed location determined by a number of constraints, such as size, thermal dissipation, center of gravity, rigidity, EMC immunity. The boxes are linked to one another by a variety of electric wiring or harness.

Presently known arrangements for housing and securing such electronic boxes to the inside of a satellite or similar vehicle have the drawback of subjecting the equipment to amplification load coming from dynamic coupling environment. More particularly, a dynamic coupling is said to exist when a source of force (or acceleration) applies to the satellite a given force or acceleration (input force), and the equipment is subjected to a force or acceleration (output force) that is larger than that of the source. A relatively high level of force (or acceleration) applied to the payload requires the use of special and complex structures for mounting the payload that increases the overall mass of the satellite.

SUMMARY OF THE INVENTION

It is the object of the present invention to overcome the above drawbacks and more precisely to prevent dynamic coupling between the two mechanical environments made up by the container housing the equipment and the equipment items.

This object is achieved through a structure and a method for housing equipment pieces in space vehicles in which the pieces of equipment are suspended to the inside of a sealable container, said container is then closed and filled by a light-weight loose material and a nonfreezing thermally conducting liquid under pressure.

BRIEF DESCRIPTION OF THE DRAWINGS

The invention will now be disclosed in detail with particular reference to the attached drawings illustrating a non limiting preferred embodiment of the invention, in which:

FIG. 1 is a schematic cross section view of a structure according to the invention;

FIG. 1A is an enlarged view of a detail of FIG. 1; and

DETAILED DERCRIPTION OF THE INVENTION

Figure 2:
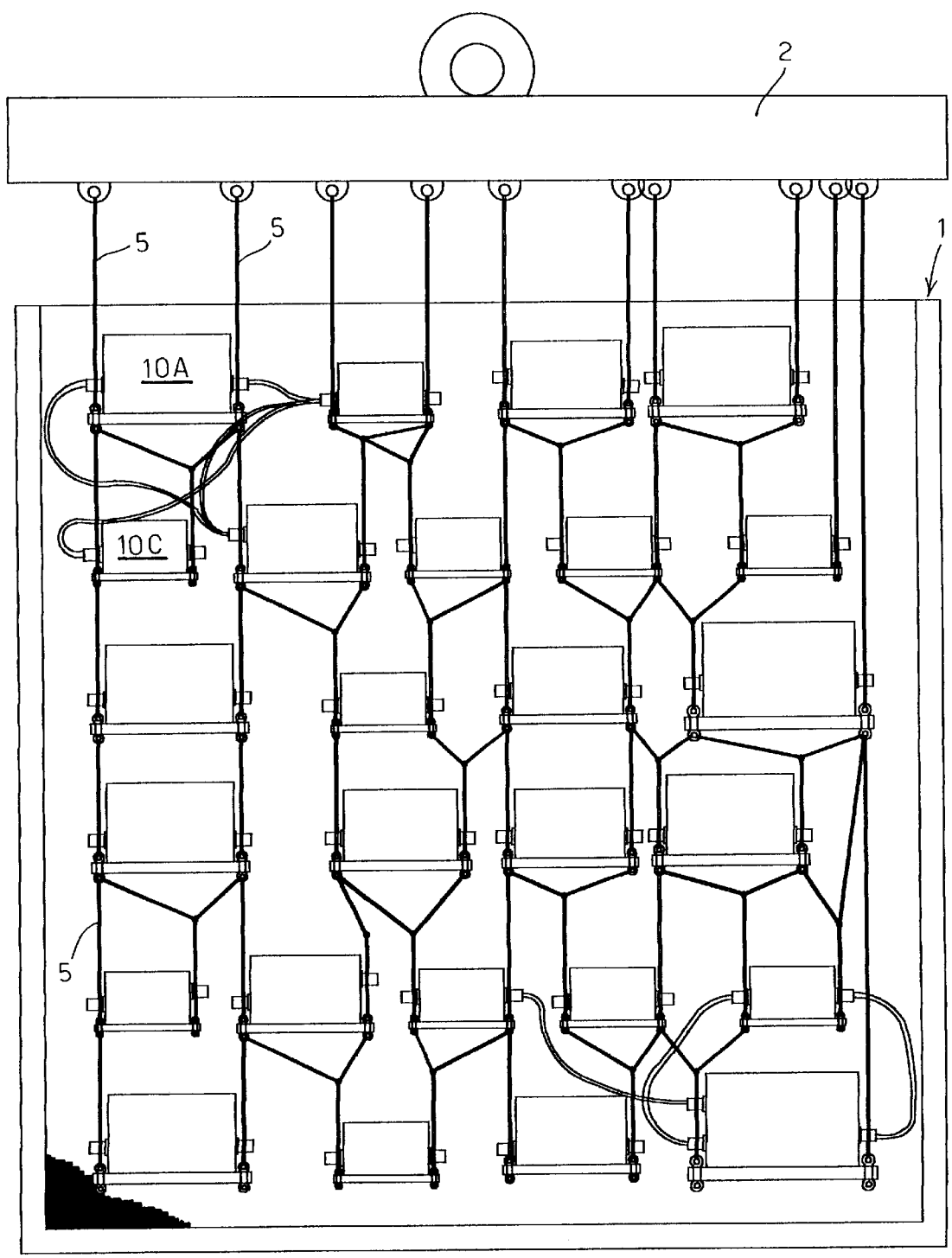
FIG. 2 is a more detailed view of a main container in its integration phase.

With reference to the drawings, the structure of the invention comprises a main container 1 and a cover 2 adapted to sealingly close the container through conventional means that are not illustrated in the drawings.

The main container 1 has a generally cylindrical shape, but also a cubic box could be chosen, and the cover 2 is provided with a filling port 3 and a relief valve 4.

A number of equipment pieces 10A, 10B, . . . , 10N are mechanically suspended within the container 1 through wires or a set of hoisting devices 5 so that the location of each item is not fixed.

Then the container is hermetically closed by applying the cover and a filler is introduced into the container through the filling port 3 so as to fill the voids (vacancies) and pressurize it of some millibars in respect of the external atmospheric pressure.

Thus each individual item of the equipment can move but only within a very small portion of the main container.

Preferably the filler has elastic plus mechanical absorption properties so that when the container is subjected to an acceleration, the items inside the container are accelerated of an amount lower than that of the source of acceleration, i.e. there is no amplification factor.

The filler comprises a light-weight loose material and a nonfreezing thermally conducting liquid. The light-weight (or low density) loose material can be formed for example by balls of a polymeric material such as preferably polystyrene or polyurethane, or other shock absorbing polymeric materials such as polyisocianurate, cellular glass, styrofoam, perlite and phenolic-based products, mineral wood, dichloro-fluoro-ethane based products, elastomers, synthetic rubber, polyethylene-based products, cellulose-made products, polyamide-based products.

The polymeric balls are mixed with a nonfreezing conducting liquid such as water or mineral oil, with anti-freezing mixture.

After suspending the items and completing the functional tests, the main container is filled with polystyrene balls so that the equipment items can stand up without falling when loosing the hoisting devices. Afterwards the main container is closed and through the filling port other polystyrene is admitted to slightly pressurize the container by specific Fluid Ground Support Equipment (FGSE) so to eliminate vacancies inside the container 1.

Finally watery matter or in general a thermally conductive not freezing liquid is admitted into the container, always through the filling port 3, to fill the air gaps left among the balls so that at last only liquid and polystyrene is found around the equipment items. Of course the equipment items and the connectors are water-tight.

The filler, that is a very light density material, wraps the equipment items located inside the main container 1 in a tridimensional configuration. This very compact configuration strongly reduces the envelope sizes of the overall layout. Since the liquid is thermally conductive it can dissipate power with $n*4\pi*r^2$ equivalent radiative surface, where n is the number of balls of radius r enclosed in the main container. This constitutes more than 1,000 times of radiation surface than in any other ever built satellite.

When using a structure according to the invention, the force acting on the payload due to the acceleration applied by a launcher generates onto the spacecraft (S/C) main box (primary structure) a quasi-static load of 3–4 g along any directions and the single equipment item should not be subjected to an acceleration higher than that. This low level of acceleration allows to greatly simplify the equipment structure thus reducing the mass by a significant amount.

Moreover, the arrangement leaves free room around the equipment items with an easier handling for operational checks.

The small size of the overall layout and the equipment suspension permit to have less stringent specification as far as the S/C center of gravity is concerned. This important parameter can in fact be modified to best satisfy the launcher specifications up to the final integration process where equipment accommodation inside the main container can still be changed following mass balance results.

Equipment integration can begin without primary structure availability, so integration and preliminary functional tests take place immediately after procurement. Dummies can be used when the equipments are not available yet, so to already find final solutions for harness requirements.

Although the invention has been disclosed with reference to preferred and non-limiting embodiments, the same is not to be meant as limited to the illustrated examples but extends to include all the modifications and changes that will become evident to the skilled of the art in view of the preceding disclosure.

What is claimed is:

1. A structure for housing electronic equipment pieces in a space vehicle, characterized in that it comprises:
   a. a sealable main container housed within said space vehicle;
   b. means for suspending said pieces of equipment to the interior of said structure; and
   c. a filler under pressure inside said sealable main container, said filler comprising a light-weight loose material and a nonfreezing thermally conducting liquid under pressure to protect said equipment pieces against the inertial forces occurring during the accelerations of the space vehicle.

2. A structure as claimed in claim 1, characterized in that said sealable container comprises a box-like container and a cover carrying a filling port and a relief valve, that can be sealingly fitted to said box-like container.

3. A structure as claimed in claim 1, characterized in that said means for suspending said pieces of equipment comprises wires or a set of hoisting devices.

4. A method for housing equipment pieces in space vehicles, characterized in that it comprises the steps of:
   a. providing a sealable main container;
   b. suspending said pieces of equipment to the inside of said container;
   c. closing said container and filling the remaining inner space thereof with a filler comprising a light-weight loose material and a nonfreezing thermally conducting liquid under pressure to protect said equipment pieces against the inertial forces occurring during the accelerations of the space vehicle; and
   d. placing said container in said space vehicle.

5. A method as claimed in claim 4, characterized in that said light-weight loose material comprises balls of a shock absorbing polymeric material.

6. A method as claimed in claim 5, characterized in that said polymeric material is selected from the group consisting of: polystyrene, polyurethane, polyisocianurate, cellular glass, styrofoam, perlite and phenolic-based products, mineral wood, dichloro-fluoro-ethane based products, elastomers, synthetic rubber, polyethylene-based products, cellulose-made products, polyamide-based products.

7. A method as claimed in claim 4, characterized in that said nonfreezing thermally conducting liquid is selected from the group consisting of: a mixture of water or mineral oil, or water based liquids, or oil-based liquids, and antifreezing liquids.

8. A method as claimed in claim 4, characterized in that said filling step comprises:
   admitting an amount of said light-weight loose material into said container;
   filling the container with said thermally conducting liquid.

9. A structure as claimed in claim 2, characterized in that said means for suspending said pieces of equipment comprises wires or a set of hoisting equipment.

10. A method as claimed in claim 5, characterized in that said filling step comprises:
    admitting an amount of said light-weight loose material into said container;
    filling the container with said thermally conducting liquid.

11. A method as claimed in claim 6, characterized in that said filling step comprises:
    admitting an amount of said light-weight loose material into said container;
    filling the container with said thermally conducting liquid.

12. A method as claimed in claim 7, characterized in that said filling step comprises:
    admitting an amount of said light-weight loose material into said container;
    filling the container with said thermally conducting liquid.

* * * * *